United States Patent
Buehler

(10) Patent No.: US 10,771,145 B2
(45) Date of Patent: Sep. 8, 2020

(54) POWER EFFICIENCY IN BEAMFORMING RF SYSTEMS

(71) Applicant: SEAKR ENGINEERING, INC., Centennial, CO (US)

(72) Inventor: Erik Buehler, Castle Rock, CO (US)

(73) Assignee: SEAKR ENGINEERING, INC., Centennial, CO (US)

(*) Notice: Subject to any disclaimer, the term of this patent is extended or adjusted under 35 U.S.C. 154(b) by 0 days.

(21) Appl. No.: 15/456,086

(22) Filed: Mar. 10, 2017

(65) Prior Publication Data

US 2017/0264360 A1    Sep. 14, 2017

Related U.S. Application Data

(60) Provisional application No. 62/307,150, filed on Mar. 11, 2016.

(51) Int. Cl.

| | |
|---|---|
| H03K 11/00 | (2006.01) |
| H04L 25/60 | (2006.01) |
| H04L 25/64 | (2006.01) |
| H04B 7/185 | (2006.01) |
| H04B 7/06 | (2006.01) |
| H04B 1/04 | (2006.01) |
| H04B 7/08 | (2006.01) |

(Continued)

(52) U.S. Cl.
CPC .......... *H04B 7/18515* (2013.01); *H03F 1/02* (2013.01); *H03F 3/24* (2013.01); *H04B 1/0475* (2013.01); *H04B 7/0617* (2013.01); *H04B 7/086* (2013.01); *H04B 2001/045* (2013.01); *Y02D 70/444* (2018.01); *Y02D 70/446* (2018.01)

(58) Field of Classification Search
CPC . H04B 7/155; H04B 7/15542; H04B 7/15585
See application file for complete search history.

(56) References Cited

U.S. PATENT DOCUMENTS

| | | | | |
|---|---|---|---|---|
| 6,104,343 A | * | 8/2000 | Brookner | H01Q 3/26 342/372 |
| 6,377,558 B1 | * | 4/2002 | Dent | H01Q 3/40 342/354 |

(Continued)

OTHER PUBLICATIONS

International Search Report, PCT/US2017/021891, dated Jun. 29, 2017.

(Continued)

*Primary Examiner* — Shuwang Liu
*Assistant Examiner* — Gina Mckie
(74) *Attorney, Agent, or Firm* — Perkins Coie LLP

(57) ABSTRACT

A satellite communication system processes a plurality of input signals to generate beamformed signals, drives a plurality of nonlinear power amplifiers with the beamformed input signals to produce RF signals for transmission; and transmits the RF signals with a plurality of Tx antenna elements. Conversion to and from linear signals to and from nonlinear or digitized signals is performed. Temporal or spatial decorrelation of the beamformed signals is employed to reduce the impact of intermodulation products. In some cases the power amplifiers are nonlinear, and can be one-sided or two-sided and produce two or three distinct output levels.

20 Claims, 10 Drawing Sheets

(51) Int. Cl.
*H03F 1/02* (2006.01)
*H03F 3/24* (2006.01)

(56) References Cited

U.S. PATENT DOCUMENTS

| | | | | |
|---|---|---|---|---|
| 6,823,170 | B1* | 11/2004 | Dent | H04B 7/18515 |
| | | | | 342/368 |
| 7,504,976 | B1 | 3/2009 | Pellon | |
| 7,627,287 | B2* | 12/2009 | Moss | H04B 1/525 |
| | | | | 375/211 |
| 9,548,878 | B2 | 1/2017 | Gupta et al. | |
| 2003/0179832 | A1* | 9/2003 | Greenwood | H03F 1/0294 |
| | | | | 375/297 |
| 2005/0242889 | A1* | 11/2005 | Mitani | H03C 5/00 |
| | | | | 331/16 |
| 2007/0001768 | A1 | 1/2007 | Kim | |
| 2007/0285312 | A1* | 12/2007 | Gao | H01Q 1/246 |
| | | | | 342/367 |
| 2009/0054014 | A1* | 2/2009 | Seo | H04B 1/0483 |
| | | | | 455/101 |
| 2009/0285331 | A1 | 11/2009 | Sugar | |
| 2012/0112962 | A1 | 5/2012 | Rofougaran | |
| 2013/0083676 | A1* | 4/2013 | Stager | H04L 27/0006 |
| | | | | 370/252 |
| 2014/0119197 | A1* | 5/2014 | Maca | H04B 17/327 |
| | | | | 370/241 |
| 2015/0102959 | A1 | 4/2015 | Lier et al. | |
| 2016/0050010 | A1 | 2/2016 | Buehler et al. | |
| 2016/0142922 | A1* | 5/2016 | Chen | H04B 7/0695 |
| | | | | 375/267 |
| 2016/0191187 | A1* | 6/2016 | Yao | H04J 13/0003 |
| | | | | 370/483 |
| 2016/0329953 | A1* | 11/2016 | Smart | H01Q 1/288 |

OTHER PUBLICATIONS

Howard, et al., "Mitigation of Correlated Non-Linearities in Digital Phased Arrays Using Channel-Dependent Phase Shifts", IEEE MTT-S International Microwave Symposium Digest, Jun. 2003, pp. 1-4, Philadelphia, PA.

* cited by examiner

POWER EFFICIENCY IN BEAMFORMING RF SYSTEMS

CROSS-REFERENCE TO RELATED APPLICATIONS

This application claims the benefit of, and claims priority to, U.S. Provisional Application No. 62/307,150, filed Mar. 11, 2016, the contents of which are incorporated herein by reference in its entirety.

BACKGROUND

Communications satellites are fundamentally limited in the capacity of data that they can deliver (as measured in bits per second) by their SWAP (size, weight and power). The amount of power available on the satellite combined with the power efficiency of the electronics, antennas, and the modulation techniques determine the amount of capacity the satellite can provide. Because capacity relates to the amount of revenue a satellite can generate, a seemingly small improvement in power efficiency can result in a large improvement in revenue, and thus profitability.

Conventional methods for optimizing the power efficiency of communications satellites involve exploring tradeoffs between various aspects of the satellite, including but not limited to antenna topologies and their characteristics, such as gain and side lobe behavior, carrier-to-interference ratio (C/I), carrier-to-noise ratio (C/N), the number of antenna beams, single carrier vs. multicarrier, the frequency reuse plan, amplifier power, amplifier backoff, pre-distortion, envelope elimination and restoration, utilized bandwidth, beamforming techniques and modulation techniques.

Conventional power optimization approaches are built around conventional and generally conservative assumptions about amplifier linearity and its typical effects on the overall system performance. Systems are generally designed to minimize nonlinearities, and may use worst-case assumptions about the effects of any nonlinearities that remain. These conventional approaches impose limitations in light of the capabilities of new and emerging nonlinear solid state power amplifiers (SSPA) (e.g., digital amplifiers) and digital ASIC technologies.

It is against this background that an improved RF chain architecture has been developed.

SUMMARY

In some embodiments, a system for improving the power efficiency of communications satellites having an array of RF receive antenna elements comprises: a beamformer configured to generate a plurality of beamformed signals based on a plurality of input signals received via the RF receive antenna elements; a plurality of power amplifiers configured to amplify a first plurality of signals corresponding to the plurality of beamformed signals; and an array of transmit antenna elements, wherein each transmit antenna element is configured to transmit an RF signal based on an output of one of the power amplifiers.

In some embodiments, a system for improving the power efficiency of communications satellites having an array of RF receive antenna elements comprises: a plurality of low noise amplifiers configured to amplify a plurality of analog input signals, wherein the plurality of analog input signals are received via the array of RF receive antenna elements; a plurality of ADCs configured to convert the amplified analog input signals to digital signals; and a beamformer configured to generate a plurality of beamformed signals based on the digital signals.

In some embodiments, a method for improving the power efficiency of a communications satellite having an array of RF receive antennas, an array of RF transmit antennas, a plurality of power amplifiers, and a beamformer comprises: receiving a plurality of input signals via the RF receive antennas, beamforming, using the beamformer, the plurality of input signals to generate a plurality of beamformed signals, amplifying, using the power amplifiers, a plurality of transmit signals corresponding to the plurality of beamformed signals to generate a plurality of amplified transmit signals; and transmitting, using the array of transmit antenna elements, the plurality of amplified transmit signals.

In some embodiments, a method for improving the power efficiency of a communications satellite having an array of RF receive antennas, an array of RF transmit antennas, a plurality of power amplifiers, and a beamformer comprises: receiving a plurality of input signals via the RF receive antennas, beamforming, using the beamformer, the plurality of input signals to generate a plurality of beamformed signals, amplifying, using the power amplifiers, a plurality of transmit signals corresponding to the plurality of beamformed signals to generate a plurality of amplified transmit signals; and transmitting, using the array of transmit antenna elements, the plurality of amplified transmit signals.

BRIEF DESCRIPTION OF THE DRAWINGS

The disclosure herein is described with reference to the following drawings, wherein like reference numbers denote substantially similar elements.

DETAILED DESCRIPTION

Figure 1:
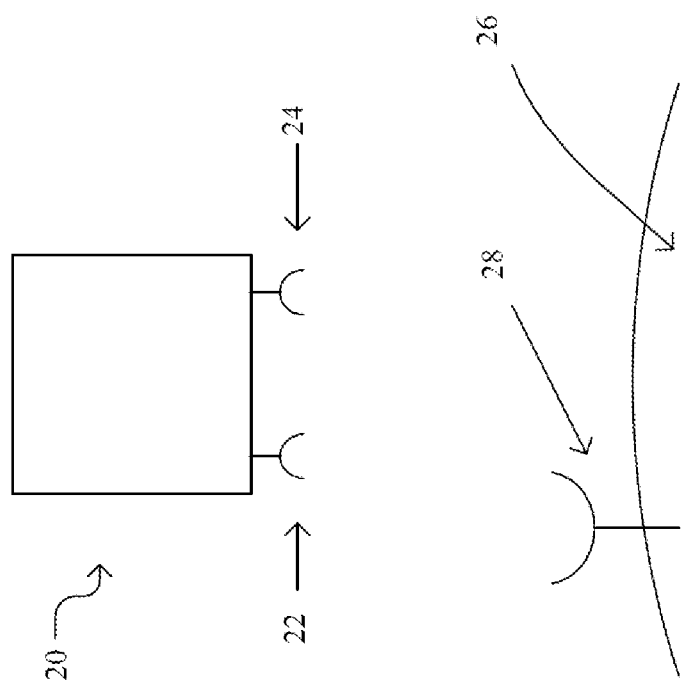
FIG. 1 is a simplified illustration of a satellite communication system.

While the embodiments disclosed herein are susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives of embodiments of the invention as defined by the claims. The disclosure is described with reference to the drawings, wherein like reference numbers denote substantially similar elements.

Nonlinearities in a satellite's RF signal chain are generally regarded as undesirable and can result in conservative estimates of signal-to-noise ratio at the receiver. These estimates can, in turn, lead to the use of more expensive hardware (either in terms of cost or power consumption) on the satellite in order to mitigate the undesirable effects of nonlinearities, such as intermodulation distortion. There may be multiple sources of nonlinearities in the satellite system, including imperfections in linear components or the use of highly nonlinear components such as digital power amplifiers or low resolution ADCs/DACs.

Digital power amplifiers can theoretically achieve power added efficiencies approaching 100% because they spend up to 100% of their time either fully conducting or not conducting, and thus, not dissipating power via resistance. Such an increase in efficiency could potentially more than double a satellite's capacity, and thus more than double the revenue it generates, within the same satellite SWAP allocation. Similarly, low resolution ADCs/DACs may consume less power and be less expensive, at the cost of highly nonlinear, low-resolution outputs. Due to the potential for savings in cost and power, techniques that enable the use of digital amplifiers and/or low-resolution ADCs/DACs on a satellite payload may be desirable.

The techniques disclosed herein use signal beamforming and/or decorrelation prior to the signal being converted from a linear signal to a nonlinear signal to compensate for various nonlinearities in the signal chain and potentially enable the use of highly nonlinear components, such as digital amplifiers and/or low-resolution ADCs/DACs, while ensuring sufficient signal quality at the receiver. As discussed in more detail below, these techniques may be particularly useful in multicarrier systems with multi-element antenna arrays such as direct radiating arrays, in which each beam is formed using multiple antenna elements.

As used herein, the term "nonlinear amplifier" may refer to any amplifier that introduces nonlinearities into a signal, including nonlinearities that may cause or worsen intermodulation distortion. Nonlinear amplifiers may include nominally linear amplifiers that introduce nonlinearities due to imperfect behavior. Nonlinear amplifiers may include amplifiers that are highly nonlinear by design, such as digital amplifiers or SSPAs, which are designed to maximize the fraction of the time they spend in a fully conducting state or a fully non-conducting state, with the rest of the time spent transitioning between non-conducting and fully-conducting, with no linear region in their operating range. To maximize power efficiency, such an amplifier must minimize the amount of time it spends in the transition state. Examples of digital amplifiers include, but are not limited to, 1) a two-sided digital amplifier configuration, typically in a push-pull arrangement, producing two or three distinct voltage level or current level outputs in which one or the other side of the amplifier is conducting, transitioning or not conducting at any time, but where neither side is conducting at the same time as the other side, and 2) a single-sided digital amplifier configuration producing two voltage or current level outputs in which the amplifier is either conducting, transitioning or not conducting. The fraction of the time the amplifier spends in a conducting vs a non-conducting state is referred to as the "conduction angle."

Digital amplifiers, along with other solid state electronic devices, need to be designed and operated with consideration for the ionizing radiation environment present in space. The ionizing radiation environment can impact the total ionizing dose (TID) and/or single event effects (SEE) performance of solid state electronics devices including amplifiers and digital ASICs. Specific SEE phenomena include single event latchup (SEL), single event upset (SEU), single event transient (SET), and single event functional interrupt (SEFI). One technique for the mitigation of TID and SEE is commonly referred to as radiation hardening by design (RHBD). Such radiation considerations are discussed in more detail later.

The disclosed techniques and apparatus may be used in a beamforming application where one antenna array with multiple antenna elements, such as a direct radiating array (DRA), forms multiple simultaneous transmit beams. In this application, each power amplifier powering each antenna element simultaneously amplifies the combination of more than one signal. This is referred to as a multicarrier scenario. Multicarrier interference causes the peak voltage or current of the combined waveform feeding the amplifier to be higher than the average voltage or current. Thus, in a conventional system, if the signal is not attenuated sufficiently relative to its average power prior to amplification, significant distortion will occur within the amplifier. This pre-amplification attenuation is referred to as "output back-off," and it reduces the effective power-added-efficiency (PAE) of the amplifier, causing precious satellite power to be wasted. Without back-off, intermodulation products (IMPs) would spread within the occupied bandwidth, decreasing the NPR (noise power ratio) and thus limiting the effective SNR (signal to noise ratio) of each transmitted signal. Conventional wisdom generally assumes that the transmitted SNR establishes an upper bound on the achievable SNR at the receiver. However, the techniques disclosed herein take advantage of some of the properties of beamforming to mitigate the impact of the intermodulation distortion, and thus increase the effective SNR at the receiver relative to the effective SNR (NPR) out of each amplifier.

In the techniques described herein, input signals from a receive (Rx) antenna (or an array of Rx antenna elements) are beamformed prior to transmission such that every input signal is used to form a plurality of output beams. In some embodiments, beamforming includes multiplying each input signal by an independent set of complex weights, with one set of weights for each output beam to be formed. The weighted signals are then summed to produce the signals to feed to a power amplifier, which in turn feeds an amplified transmit signal to a corresponding output (Tx) antenna element. A person of skill in the art will appreciate that beamforming may be performed using analog components, digital components (such as microprocessors or FPGAs), or as a hybrid analog/digital process using a mixture of analog and digital components.

In some embodiments, beamforming generates one beamformed signal per output antenna element, wherein each beamformed signal contains the weighted combination of all of the Rx signals which are to be transmitted in one or more Tx beams via an array of Tx antenna elements, such as a direct radiating array or other type of antenna array. In some embodiments, linear beamformed signals may be converted to nonlinear signals prior to transmission by the antennas.

Each beamformed signal is optionally processed to reduce the correlation of its intermodulation products (IMPs) with the IMPs in the other beamformed signals. The intermodulation decorrelation of IMPs may be performed as part of the beamforming process, or may be performed on the signals after they have been beamformed but prior to their (optional) conversion from linear signals to nonlinear signals. Such conversion may occur within a nonlinear power amplifier in the signal chain, for example, or in a low-resolution DAC, or in another component that performs linear-to-nonlinear conversion. In some embodiments, intermodulation decorrelation may occur after signals have been beamformed but before they are converted to nonlinear signals by a nonlinear power amplifier (e.g., a digital power amplifier). In some embodiments, intermodulation decorrelation may occur after signals are beamformed and amplified (e.g., by a power amplifier), but before they are converted to nonlinear signals by a DAC or other type of linear to nonlinear converter.

The intermodulation decorrelation processing step may include, but is not limited to, the addition of in-band dither or out-of-band dither to a signal, or in-band crest-factor-reduction or out-of-band crest-factor-reduction of a signal. Other dithering techniques used for intermodulation decorrelation may include applying random DC bias and/or gain to each signal or the use of delta-sigma modulation, for example. A person of skill in the art will recognize that a wide variety of dithering techniques may be used.

Decorrelation can be used to improve the spatial decorrelation and/or temporal decorrelation of the intermodulation products, spreading the IMPs out-of-band and improving the effective in-band SNR (NPR). Signals may be spatially and/or temporally decorrelated using the above-described techniques.

After the optional intermodulation decorrelation step, the beamformed signals may be converted from a linear but quantized digital representation of the signal to a nonlinear analog representation of the signal. As described above, in some embodiments, the conversion takes place inside of a conventional, but low resolution DAC. In other embodiments, the conversion takes place within a nonlinear power amplifier.

In some embodiments, a low resolution DAC may be a DAC having fewer than 8 bits of resolution. In some embodiments, a low resolution DAC may be a 1.5 bit DAC having only 3 discrete output levels such as +1 volt, 0 volts and −1 volt. Similarly, a low resolution ADC may be an ADC having fewer than 8 bits of resolution, such as 1-bit ADC, 1.5-bit ADC, or 2-bit ADC for example, and having fewer than 6 discrete output levels.

The beamformed (and optionally decorrelated) signals may be provided to nonlinear amplifiers to be amplified, and then transmitted (e.g., radiated) to Earth by the Tx antenna elements.

The above-described technique is also applicable in the receive direction whereby the data out of low resolution ADCs that sample the output of an antenna array are beamformed as disclosed herein to increase the effective SNR via the same intermodulation decorrelation technique. In this case, the signal is converted from a linear analog signal to a nonlinear digital signal by an ADC prior to beamforming. The IMPs of the linear analog signals can optionally be decorrelated prior to conversion and beamforming using, for example, dithering, delta sigma modulation, or any other appropriate decorrelation approach such as those described with respect to the Tx side.

It should be understood that converting between linear and nonlinear representations or vice versa could be done either on only the transmitting side, on only the receiving side, or on both the receiving and transmitting sides. None of the descriptions herein are intended to limit the application of these teachings to strictly Tx, Rx or the combination of Tx and Rx systems.

On the Tx side, each amplified Tx signal may be highly distorted by the linear to nonlinear conversion process, typically having an NPR ranging somewhere between 2 dB and 8 dB, depending on the particular nonlinear amplifier design or low-resolution DAC. However, because the signals are beamformed prior to amplification, the decorrelated intermodulation products between all the Tx antenna elements, as seen at the receiver, add up incoherently, while the received beamformed signals from all of the Tx antenna elements add up coherently. Thus, the effective NPR (SNR upper bound) seen at the ground receiver (in dB) is as follows:

$$NPR = Tx\ NPR + 10 * \log_{10}((\# \text{ of } Tx \text{ elements})(\# \text{ of co-frequency beams})^{-1}) \qquad \text{Eq. 1}$$

For example, if the NPR out of each Tx antenna element is 6 dB, and there are 1024 direct-radiating elements with uniform illumination and uniform gain at the receiver, and there are 64 co-frequency Tx beams, then according to Eq. 1 the SNR upper bound at the receiver on the ground would be 18 dB.

For comparison, for a linearized power amplifier with a saturated power efficiency of 50% to achieve an 18 dB NPR, it would need to be backed off by roughly 3 dB. In this example, its effective power added efficiency would therefore be 25% instead of 50%. Thus, the disclosed techniques can yield both a significant power savings and improved signal quality at the receiver relative to more conventional approaches.

FIG. 1 shows a satellite 20 with a receive antenna 22 and a transmit antenna 24. Each antenna 22 and 24 may include an array of separate antenna elements. An array of separate antenna elements may be used to implement a direct radiating array, for example. The satellite 20 may be positioned in space above the Earth 26 where one or more Earth-based antennas 28 may be used for transmitting signals to the satellite 20 and receiving signals from the satellite 20. In this and the remaining drawings, many components within the satellite are omitted or simplified for ease of illustration and explanation.

Figure 2:
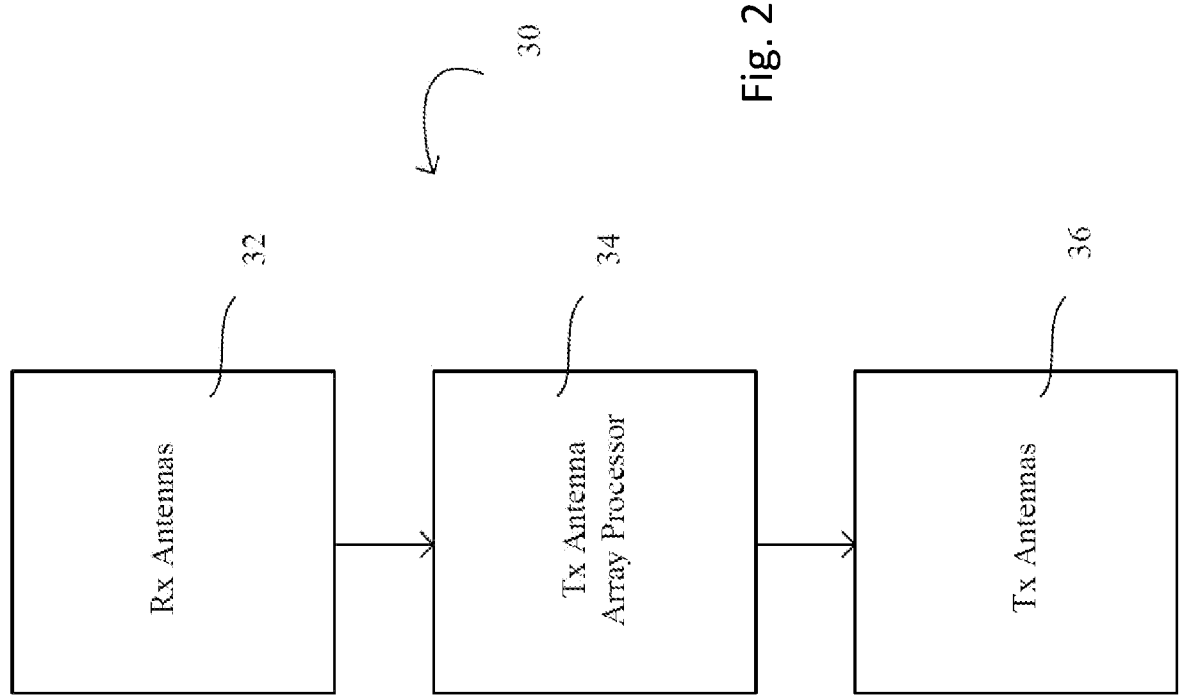
FIG. 2 is a block diagram of portions of a satellite communication system.

FIG. 2 shows a system 30 in which a plurality of receive (Rx) antenna elements 32 provide inputs to a transmit (Tx) antenna array processor 34, which performs various functions and feeds a plurality of Tx antenna elements 36. The Tx antenna array processor 34 may perform beamforming and/or intermodulation decorrelation of the signals received from the Rx antenna elements, for example. In some embodiments, the Tx antenna array processor 34 includes digital processing or storage components (such as a microprocessor, memory, FPGA, etc.), analog components, or a combination of the two. In some embodiments, the Tx antenna array processor 34 includes ADCs and/or DACs.

Figure 3:
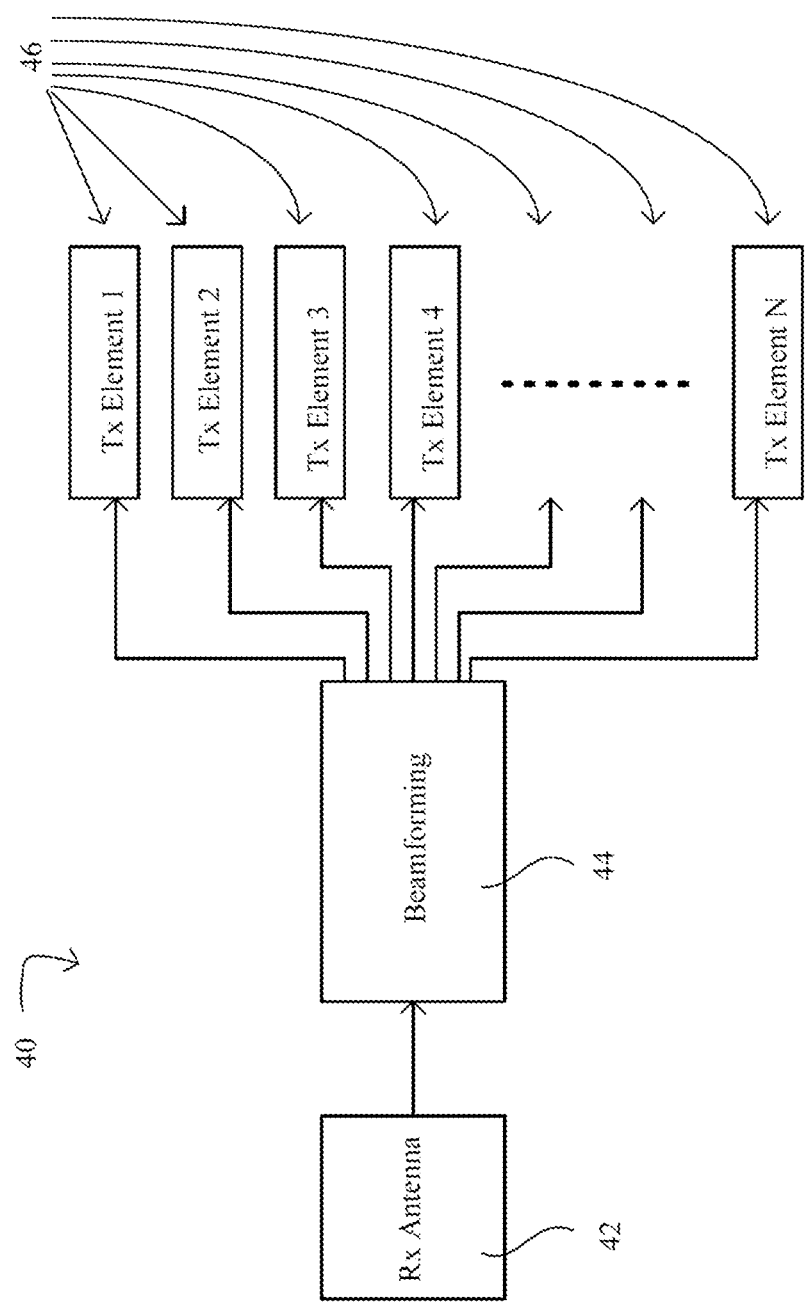
FIG. 3 is a block diagram of portions of a satellite communication system.

FIG. 3 shows a system 40 in which a plurality of Rx antenna elements 42 provide input signals to a beamformer 44, which generates a plurality of beamformed signals based on the input signals received from the Rx antenna elements. The beamformed signals are then provided to one or more nonlinear power amplifiers, either directly or by way of one or more DACs. In some examples, the beamformer 44 generates one beamformed signal for each of a plurality of Tx antenna elements 46.

Figure 4:
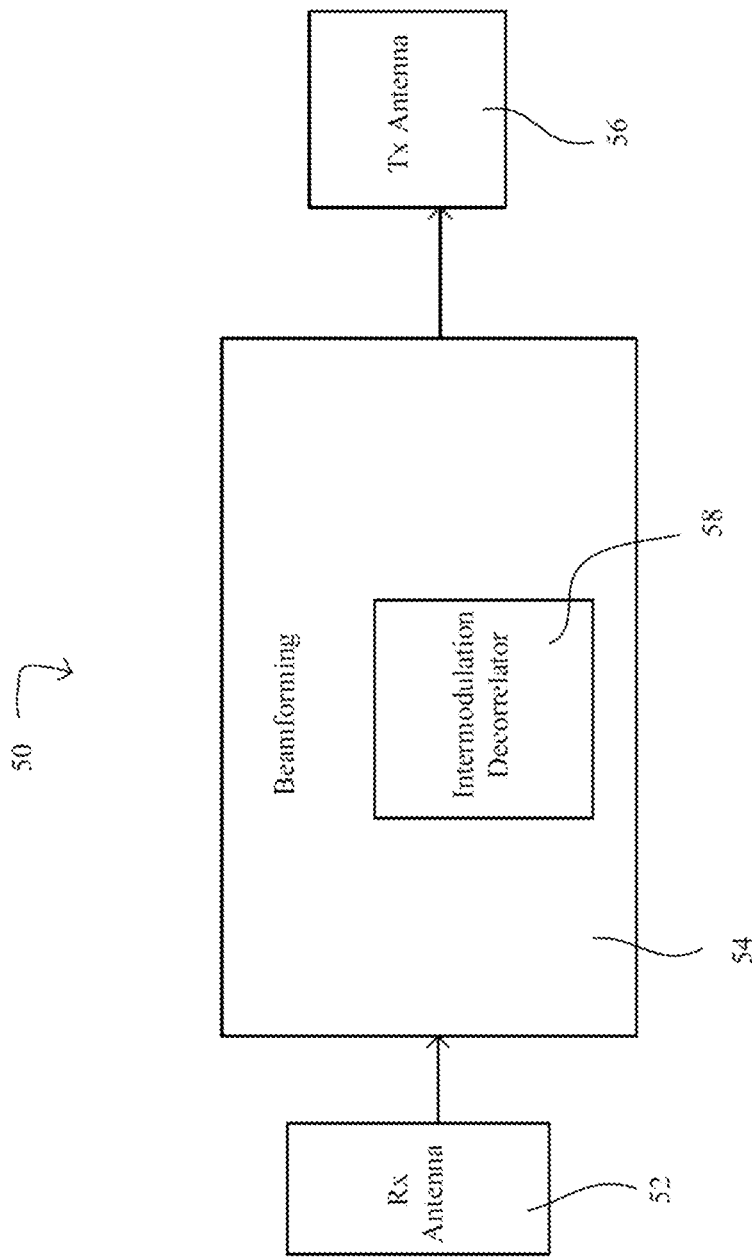
FIG. 4 is a block diagram of portions of a satellite communication system.

FIG. 4 shows exemplary system 50 in which a plurality of Rx antenna elements 52 provide inputs to a beamformer 54, which processes the inputs to generate beamformed signals. The beamformed signals are provided to a plurality of Tx antenna elements 56. In some embodiments, system 50 includes an intermodulation decorrelator 58 that may decorrelate the beamformed signals temporally or spatially. In some embodiments, intermodulation decorrelator 58 may be physically or logically part of beamformer 54. In some embodiments, intermodulation decorrelator 58 may be physically or logically separate from beamformer 54.

Figure 5:
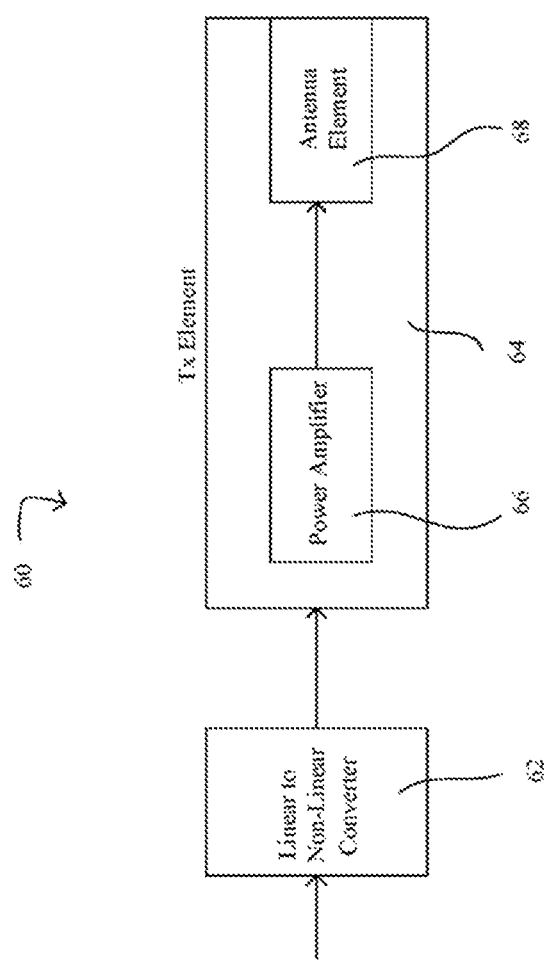
FIG. 5 is a block diagram of portions of a satellite communication system.

FIG. 5 shows a portion 60 of some of the systems described herein. A linear to nonlinear converter 62 may create digital signals (at two or three levels) that are provided to a power amplifier 66. In some embodiments, the linear to nonlinear converter 62 may be a low resolution DAC that provides inputs to a power amplifier, for example. In some embodiments, the linear to nonlinear converter may be part of a nonlinear power amplifier. In some embodiments, the power amplifier 66 provides an amplified signal to a transmit antenna element 68.

Figure 6:
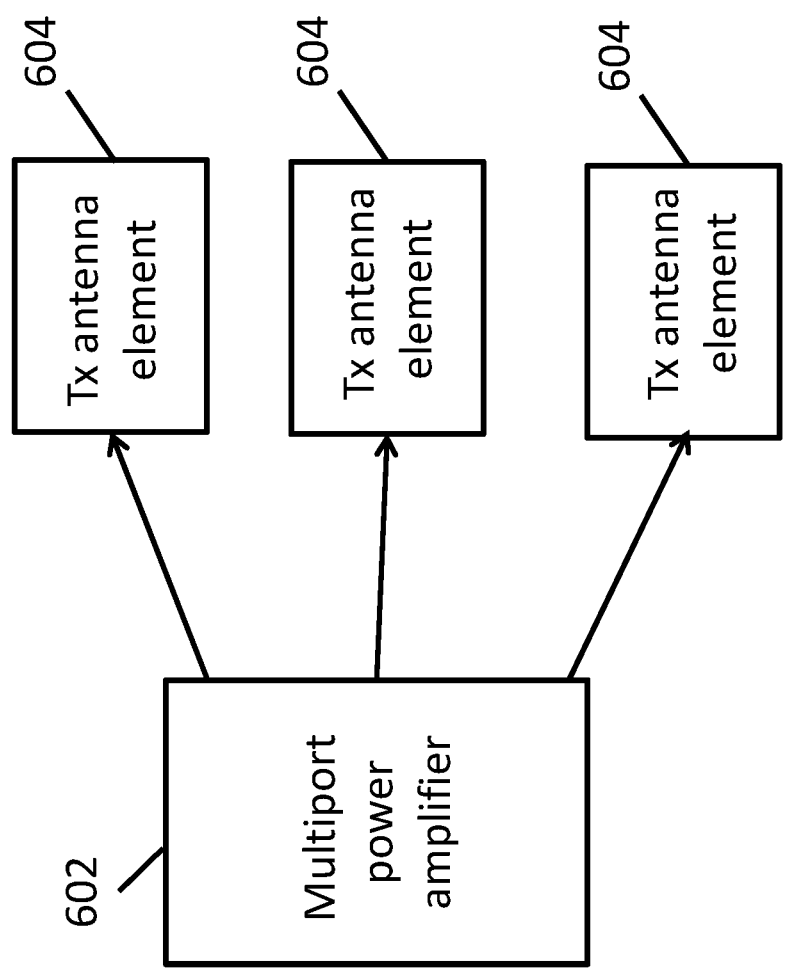
FIG. 6 is a block diagram of portions of a satellite communication system.

Alternatively, as depicted in FIG. 6, instead of using a separate power amplifier for each transmit antenna element, one or more multiport power amplifiers 602 could be used to feed multiple transmit antenna elements 604. In this case, multiple transmit antenna elements receive outputs from the same multiport power amplifier.

Figure 7:
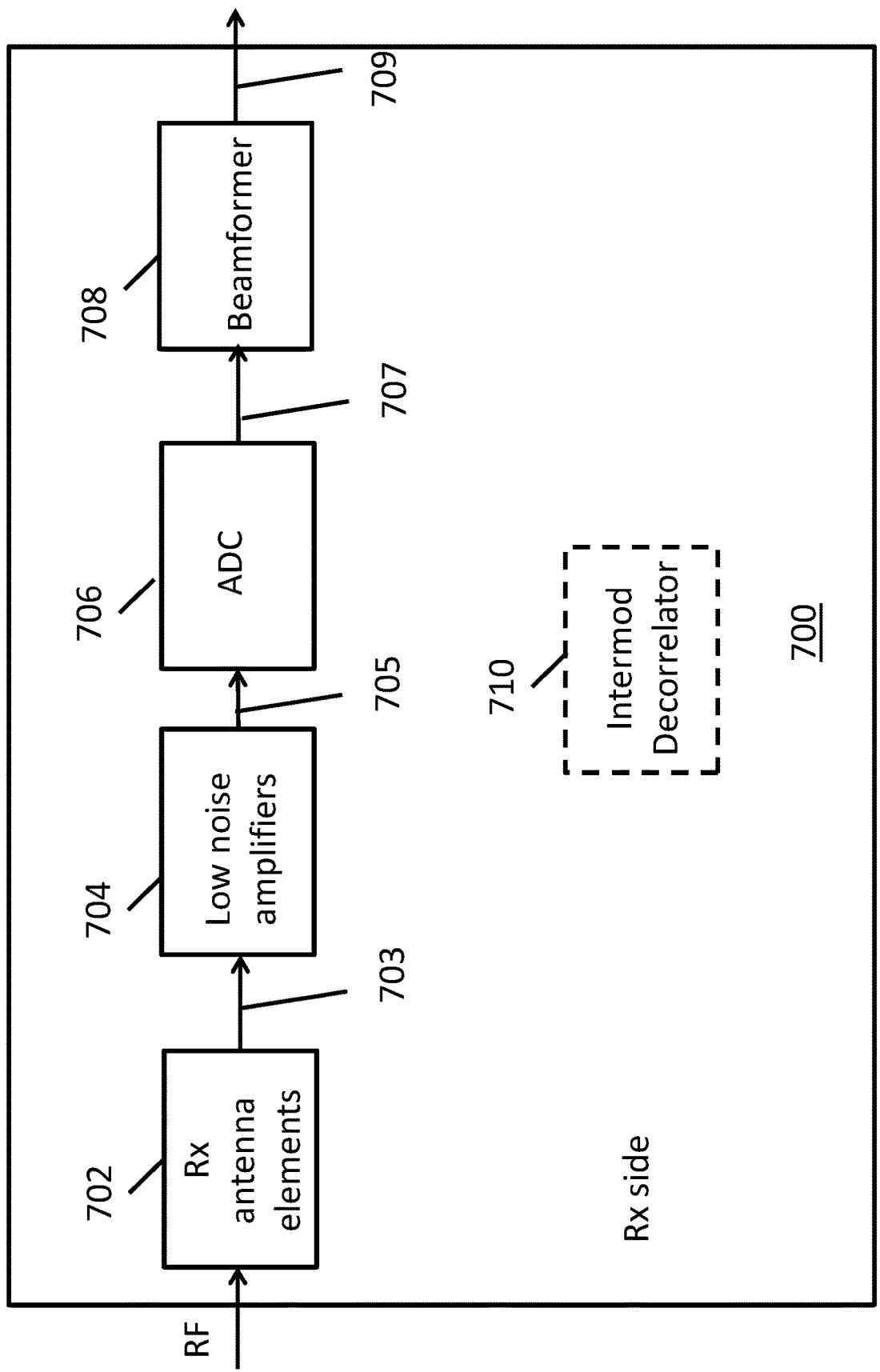
FIG. 7 is a block diagram of portions of a satellite communication system.

FIG. 7 depicts an exemplary block diagram of the receive side of an exemplary RF signal chain 700 that includes optional intermodulation decorrelator 710. In this example, an array of RF receive (Rx) antenna elements 702 receive RF signals and provide analog input signals 703. Analog input signals 703 may be provided to low noise amplifiers (LNA) 704, which are configured to amplify the analog input signals. Amplified input signals 705 at converted from linear analog signals to nonlinear digital signals by ADCs 706. In some embodiments, ADCs 706 are low resolution ADCs. Optionally, amplified analog input signals 705 are decorrelated by intermodulation decorrelator 710 prior to conversion by ADCs 706. In some embodiments, intermodulation decorrelator 710 decorrelates the intermodulation products of signals using dithering or other types of decorrelation, for example.

Nonlinear digital signals 707 are provided to beamformer 708, which is configured to beamform the digital signals 707 to generate beamformed signals 709. In some embodiments, beamformer 708 and/or intermodulation decorrelator 710 are implemented using digital components, analog components, or a combination of digital and analog components. In some embodiments, beamforming and decorrelation may mitigate the effect of nonlinearities introduced into signals by ADCs 706, such as intermodulation distortion.

Beamformed signals 709 may be provided to other portions of the satellite communications systems, such as to the Tx side of the RF signal chain, for example.

Figure 8:
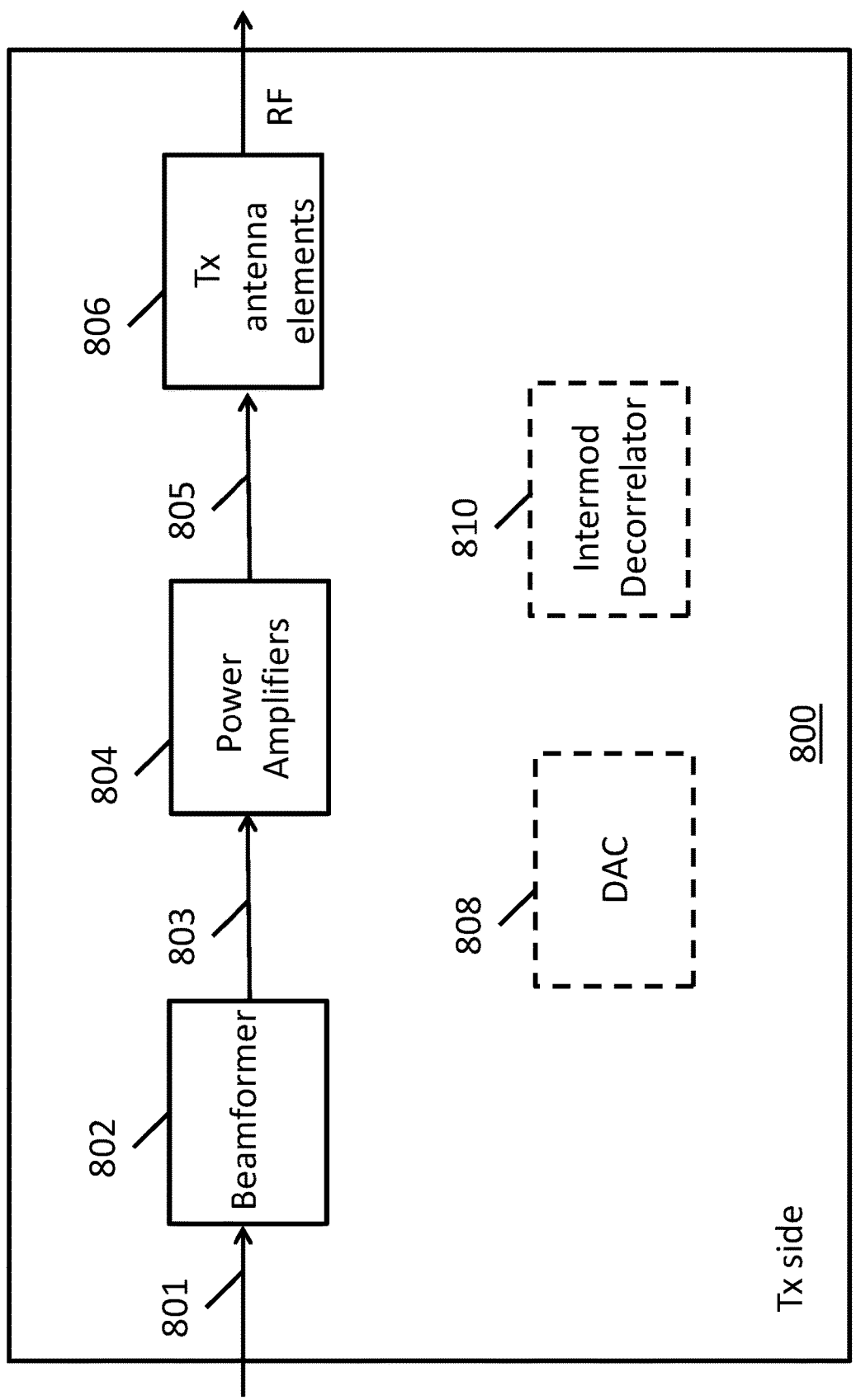
FIG. 8 is a block diagram of portions of a satellite communication system.

FIG. 8 depicts an exemplary simplified block diagram of the transmit side of an exemplary RF signal chain 800 that includes optional intermodulation decorrelator 810 and optional DAC 808. In this example, an array of RF receive (Rx) antenna elements (such as Rx antenna elements 42 in FIG. 3 or Rx antenna elements 702 in FIG. 7) receive input signals and provide signals to the transmit side of the RF signal chain 800, either directly or after processing by an input LNA, beamformer, or other components (such as depicted in FIG. 7). Beamformer 802 generates beamformed signals 803 based on input signals 801 received by the Rx antennas. In some embodiments, beamformer 802 is implemented using digital components, analog components, or a combination of digital and analog components.

Input signals 801 or beamformed signals 803 may, optionally, be converted from linear analog signals to nonlinear digital signals by DAC 808. In some embodiments, DAC 808 may be a low resolution DAC. In exemplary system 800, the beamformed signals 803 are provided to a plurality of power amplifiers 804 that are configured to amplify the beamformed signals 803. In some embodiments, power amplifiers 804 are nonlinear power amplifiers. In some embodiments, power amplifiers 804 are digital power amplifiers. Amplified beamformed signals 805 are provided to an array of Tx antenna elements 806. In some embodiments, each transmit antenna element is configured to transmit an RF signal based on an output of one of the power amplifiers 804.

Optionally, exemplary system 800 includes intermodulation decorrelator 810, which is configured to decorrelate the beamformed signals prior to transmission. In some embodiments, intermodulation decorrelator 810 decorrelates the beamformed signals 803 by dithering or other methods, such as described previously. In some embodiments, intermodulation decorrelator 810 is circuitry implemented using digital components, analog components, or a combination of digital and analog components. In some embodiments, beamforming and decorrelation may mitigate the effect of nonlinearities introduced into signals by power amplifier 804 or DAC 808, such as intermodulation distortion.

Figure 9:
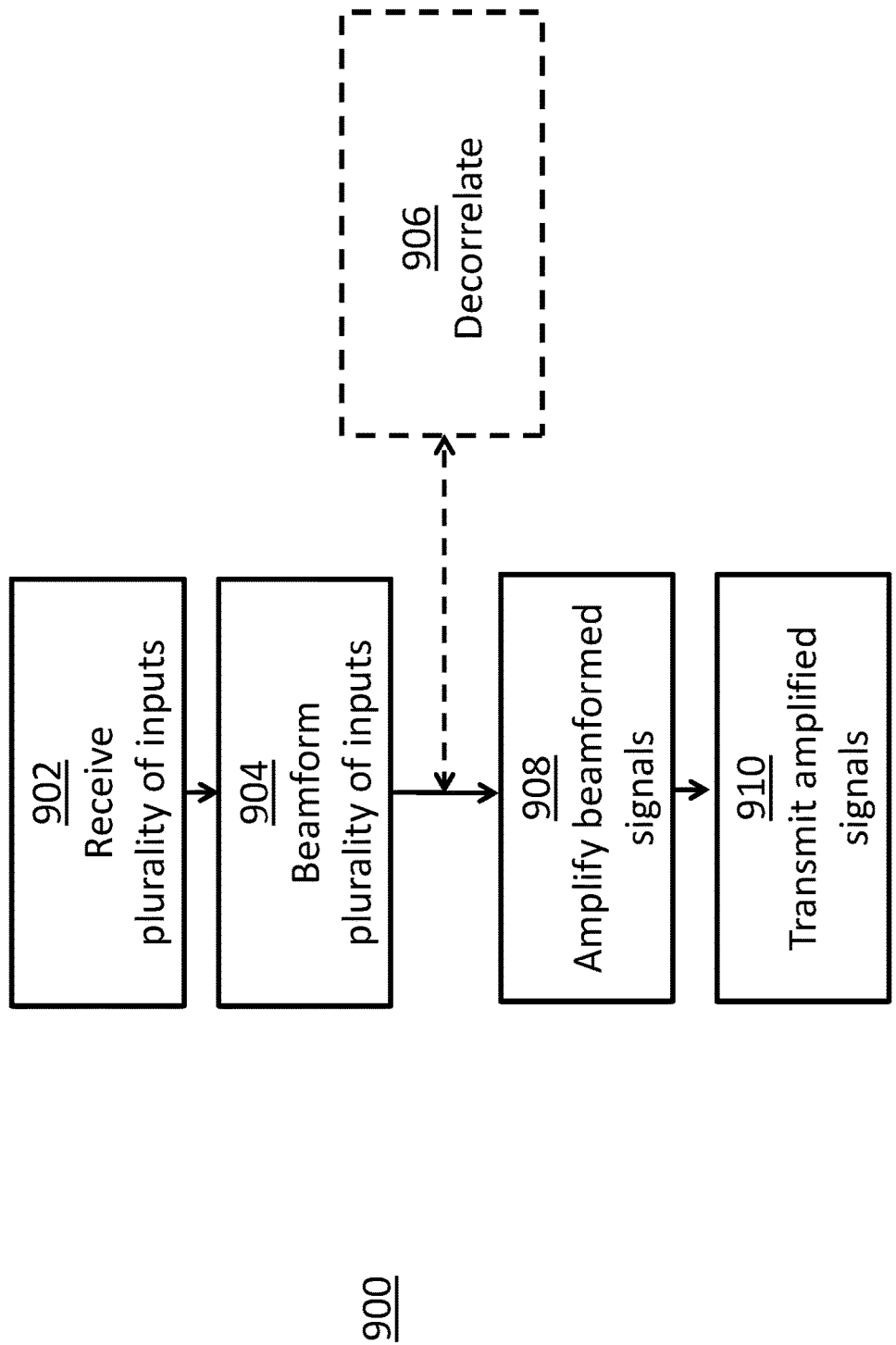
FIG. 9 depicts a method for improving the power efficiency of a satellite payload.

FIG. 9 depicts a method 900 for improving the power efficiency of a communications satellite that includes an array of RF receive antenna elements, an array of RF transmit antenna elements, a plurality of power amplifiers, and a beamformer.

At block 902, a plurality of input signals are received. In some embodiments, the input signals are received via the array of RF receive antenna elements.

At block 904, the plurality of input signals are beamformed using a beamformer, such as beamformer 802, to generate beamformed signals. In some embodiments, the plurality of input signals are beamformed by multiplying each input signal by a set of weights, for example, or using any other appropriate beamforming process. The input signals may be beamformed using analog components, digital components, or a combination of analog and digital components.

At block 908, the beamformed signals are amplified. In some embodiments, the beamformed signals are amplified using the power amplifiers. In some embodiments, the power amplifiers are nonlinear power amplifiers or digital power amplifiers.

At block 910, the amplified beamformed signals are transmitted. In some embodiments, the amplified beamformed signals are transmitted using an array of RF transmit antenna elements, for example.

Optionally, at block 906, the beamformed signals are decorrelated prior to being amplified at block 908. In some embodiments, the beamformed signals are decorrelated using dithering, for example. In some embodiments, the beamformed signals are spatially and/or temporally decorrelated.

Figure 10:
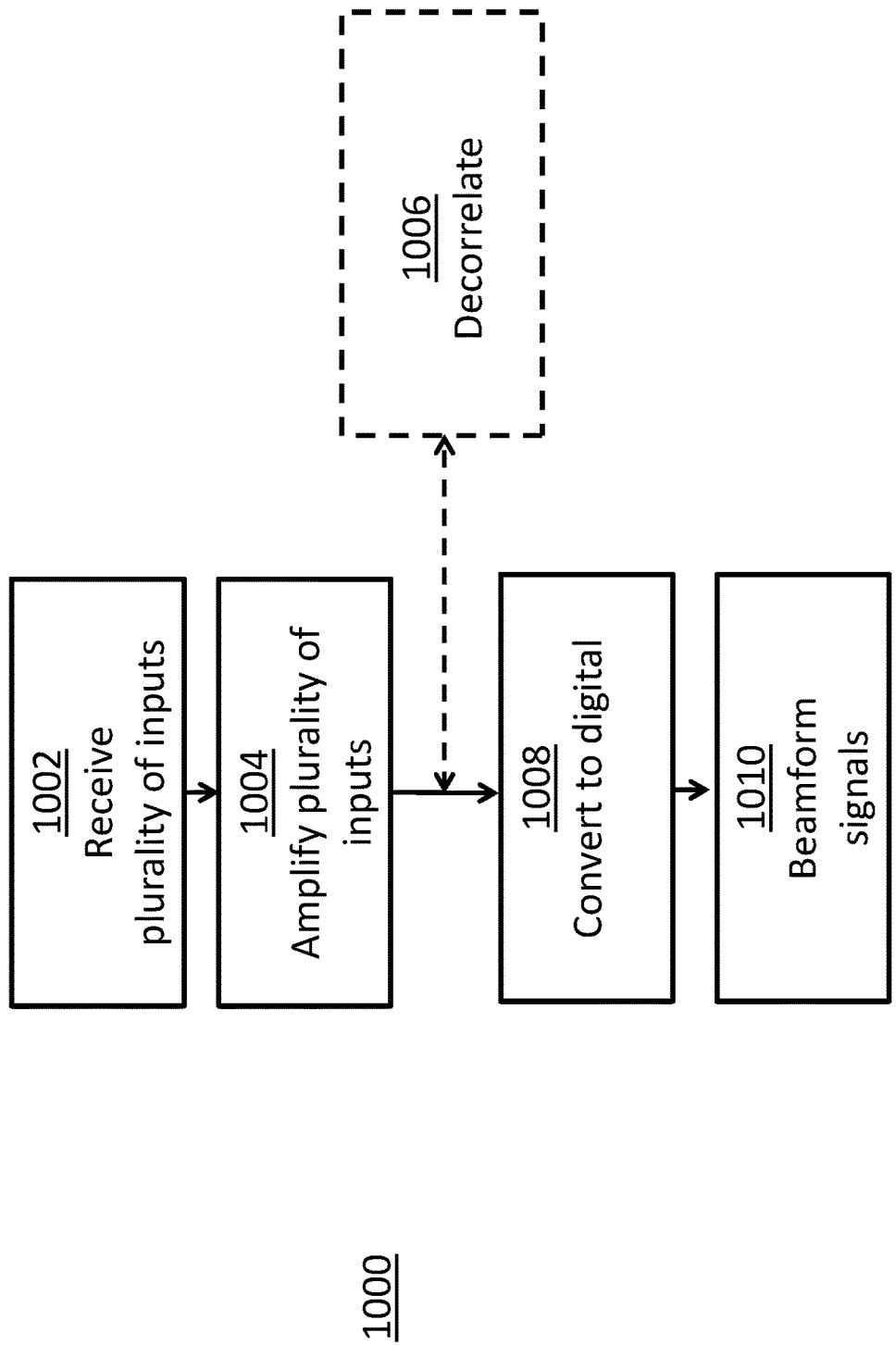
FIG. 10 depicts a method for improving the power efficiency of a satellite payload.

FIG. 10 depicts a method 1000 for improving the power efficiency of a communications satellite that includes an array of RF receive antenna elements, an array of RF transmit antenna elements, a plurality of low noise amplifiers, an ADC, and a beamformer.

At block 1002, a plurality of input signals are received. In some embodiments, the input signals are received via the array of RF receive antenna elements.

At block 1004, the plurality of input signals are amplified. In some embodiments, the input signals are amplified using the low noise amplifiers.

At block 1008, the amplified signals are converted from linear analog signals to nonlinear digital signals. In some embodiments, the signals are converted by an ADC, for example.

At block 1010, the amplified input signals are beamformed using a beamformer, such as beamformer 802, to generate beamformed receive signals. In some embodiments, the amplified input signals are beamformed by multiplying each amplified input signal by a set of weights, for example, or using any other appropriate beamforming process. The amplified input signals may be beamformed using analog components, digital components, or a combination of analog and digital components.

Optionally, at block 1006, the amplified signals are decorrelated prior to being converted at block 1008. In some embodiments, the amplified signals are decorrelated using dithering, for example. In some embodiments, the amplified signals are spatially and/or temporally decorrelated.

The systems and methods described herein compensate for nonlinearities in the signal chain due to component nonlinearities and/or due to amplifier distortion (e.g. intermodulation distortion or other forms of distortion) by beamforming the input signals prior to amplification to achieve coherent gain on the signal content and incoherent gain on the intermodulation products. The optional decorrelation step provides additional benefits in terms of signal quality at the receiver (e.g., on Earth) by reducing the received IMPs. (This step is not strictly required, however, because there is some intrinsic intermodulation decorrelation in the beamforming step without it.)

As previously noted, this approach is particularly suitable for use with direct radiating arrays or other types of phased antenna arrays in which multiple beams are transmitted (or received) at the same time. This approach can reduce power consumption on a satellite by (1) enabling the use of highly nonlinear switching-mode power amplifiers to increase amplifier efficiency; (2) reducing or eliminating spillover losses, Ohmic losses, and reflector surface roughness (when compared to a reflector fed array); and (3) enabling the use of low resolution ADCs and/or DACs, which require less power than higher-resolution components and can also reduce the required dynamic range of the digital signal processing (DSP) data path—thereby reducing the required computational complexity, gate count, and die area.

Radiation Considerations

Due to the ionizing radiation environment experienced by electronics operating in satellite applications, it may be desirable for all or portions of the electronics to be radiation hardened or radiation tolerant. This can include any or some combination of electronics that have been radiation hardened by process (having to do with the underlying semiconductor technology regarding how the electronic device is fabricated), by design (having to do with the physical layout of the circuit elements on the die) or by other means. Radiation tolerance may be determined via test, analysis, or test and analysis of devices whose design was not intentionally optimized for use in an ionizing radiation environment.

The harsh environment faced by a satellite can increase the challenge of designing electronic circuitry. One of the primary environmental risks in a satellite application is associated with the ionizing radiation environment present in space. It should be noted that radiation effects associated with ionizing radiation are also present in terrestrial applications and such radiation effects are generally termed soft errors. The ionizing radiation environment in space includes heavy ions, protons, and neutrons which can impact the normal operation of semiconductor devices via single event effects (SEE), total ionizing dose (TID), and/or displacement damage dose (DDD). The effects of TID and DDD are generally cumulative over the mission duration and impact semiconductor parameters including current leakage. The effects of SEE are generally instantaneous and can impact the operation of the semiconductor circuit. These SEE effects include single event latchup (SEL), single event upset (SEU), single event transient (SET), and single event functional interrupt (SEFI). Mitigation for SEL can be provided via use of a technology such as silicon on insulator (SOI). The effects of SEU, SET, and/or SEFI can include causing a serial communication line (commonly referred to as a lane) to go into an invalid state (an example would be loss of lock) in which valid data is no longer being transmitted or received for an extended period of time. The rate of occurrence of soft errors in terrestrial applications for a typical semiconductor chip design is significantly lower than the rate of occurrence of SEU, SET, and/or SEFI for the same semiconductor chip design in space applications.

The mitigation of SEU, SET, and/or SEFI in semiconductor chip designs for space applications can be performed using a variety of techniques including the selection and optimization of materials and processing techniques in the semiconductor fabrication (radiation hard by process (RHBP)), and by the design and fabrication of specialized structures in the design of the chip which is then fabricated via conventional materials and processes in the semiconductor fabrication process (radiation hard by design (RHBD)). There are additional techniques for providing system level mitigation in systems that include semiconductor chips that are either RHBP, RHBD, or conventional (not specifically optimized for use in an ionizing radiation environment), such SEU, SET, and/or SEFI mitigation techniques are referred to in this application as system level radiation mitigation techniques (SLRMT).

The effective design of electronics systems for use in the space ionizing radiation environment requires that the system design team make effective and efficient use of components that are either RHBP, RHBD, and/or conventional and often includes the use of SLRMT. The optimization of the component selection and SLRMT depends to a large extent on the specific details of the radiation effects that are to be mitigated and the desired level of system radiation tolerance to be obtained. Many SEU, SET, and/or SEFI are generally best mitigated as close as possible, both spatially and temporally, to where the SEE induced event occurred in the component or system level circuit to provide effective and efficient mitigation of such effects. For example, the duration of SET induced in ASIC technology nodes with a feature size<90 nm, can be <1 nSec., and can be as short as several tens of pSec for feature sizes<32 nm. The mitigation of such short duration SET within the same semiconductor package can provide for a more efficient implementation of SET mitigation relative to an approach which spans two of more chips in separate locations within the same system. This efficiency results from the ability to detect and mitigate spatially and/or temporally close to the source of the SEE induced errors.

Radiation test may be accomplished using a beam of charged particles from a particle accelerator where the charged particle beam may include protons and/or heavy ions and the accelerator may be a cyclotron or a linear accelerator. The beam energy in the case of a proton beam may be in the range of 0.1 MeV to over 200 MeV and is typically in the range of approximately ≥1 MeV to either approximately 65 or 200 MeV. The beam in the case of a heavy ion beam may have a linear energy transfer (LET) in the range of 0.1 to over 100 MeV cm$^2$/mg and is typically in the range of ≥0.5 to approximately 60 to 85 MeV cm$^2$/mg. The total fluence of particles used in such tests can vary considerably and is often in the range of $10^6$ to over $10^{12}$ particles per cm$^2$ at each beam energy in the case of a proton beam and is often in the range of $10^2$ to over $10^8$ particles per cm$^2$ at each LET value in the case of a heavy ion beam. The number of radiation induced upsets (SEU), transients (SET), and/or functional interrupts (SEFI) is often expressed as a cross section which relates to the number of observed events in a given area (typically 1 cm^2) as a function of the beam fluence. The cross section is no greater than 1.0 and can be smaller than $10^{-10}$ cm^2, it is often in the range of approximately $10^{-2}$ to $\leq 10^{-10}$ cm^2. A device is generally considered to be radiation tolerant if the number of detected SEU, SET, and/or SEFI is sufficiently small that it will not have a significant impact on the operation of the system or circuit containing one or more instances of that device. A heavy ion cross section $\leq 10^{-4}$ cm^2 at a LET$\geq$37 MeV cm^2/mg as demonstrated by test and/or analysis is an example of a cross section which may be sufficient to be demonstrate that a given device is radiation tolerant. The heavy ion or proton cross section that is measured or determined by analysis for a device at one or more beam LET values or beam energy values to be considered radiation tolerant may vary considerably and depends in part on the anticipated orbit for the satellite and the extent to which the circuit and/or system containing that device is capable of maintaining the desired operation when a SEU, SET, and/or SEFI occurs.

While the embodiments of the invention have been illustrated and described in detail in the drawings and foregoing description, such illustration and description are to be considered as examples and not restrictive in character. For example, certain embodiments described hereinabove may be combinable with other described embodiments and/or arranged in other ways (e.g., process elements may be performed in other sequences). Accordingly, it should be understood that only example embodiments and variants thereof have been shown and described.

I claim:

1. A system for improving the power efficiency of communications satellites having an array of RF receive antenna elements, the system comprising:
    a beamformer configured to generate a plurality of beamformed signals based on a plurality of input signals received via the RF receive antenna elements;
    a plurality of power amplifiers configured to amplify a first plurality of signals corresponding to the plurality of beamformed signals;
    an array of transmit antenna elements, wherein each transmit antenna element is configured to transmit an RF signal based on an output of one of the power amplifiers; and
    an intermodulation decorrelator configured to decorrelate intermodulation products of the plurality of input signals, or decorrelate intermodulation products of the plurality of beamformed signals, prior to conversion of the plurality of input or beamformed signals from linear signals to nonlinear signals.

2. The system according to claim 1, wherein the intermodulation decorrelator is configured to decorrelate intermodulation products of the plurality of input signals or beamformed signals prior to amplification of the beamformed signals by the power amplifiers, and wherein the first plurality of signals is the plurality of decorrelated beamformed signals.

3. The system according to claim 2, wherein the intermodulation decorrelator is configured to decorrelate the intermodulation products spatially and/or temporally.

4. The system according to claim 2, wherein the intermodulation decorrelator is configured to decorrelate the intermodulation products using in-band dithering, out-of-band dithering, in-band crest-factor reductions, out-of-band crest-factor reduction, or delta-sigma modulation.

5. The system according to claim 1, wherein at least one of the power amplifiers is a first nonlinear multiport power amplifier, and wherein a plurality of the transmit antenna elements receive outputs from the first multiport nonlinear power amplifier.

6. The system according to claim 1, wherein the intermodulation decorrelator configured to spread one or more intermodulation products of the plurality of beamformed signals out-of-band.

7. The system according to claim 1, wherein the beamformer is further configured to decorrelate intermodulation products (IMPs).

8. A system for improving the power efficiency of communications satellites having an array of RF receive antenna elements, the system comprising:
    a plurality of low noise amplifiers configured to amplify a plurality of analog input signals, wherein the plurality of analog input signals are received via the array of RF receive antenna elements;
    a plurality of ADCs configured to convert the amplified analog input signals to digital signals;
    a beamformer configured to generate a plurality of beamformed signals based on the digital signals; and
    intermodulation decorrelator configured to decorrelate the intermodulation products of the plurality of analog input signals prior to conversion to nonlinear signals.

9. A method for improving the power efficiency of a communications satellite having an array of RF receive antennas, an array of RF transmit antennas, a plurality of power amplifiers, and a beamformer, the method comprising:
    receiving a plurality of signals via the RF receive antennas,
    beamforming, using the beamformer, the plurality of input signals to generate a plurality of beamformed signals,
    amplifying, using the power amplifiers, a plurality of transmit signals corresponding to the plurality of beamformed signals to generate a plurality of amplified beamformed signals;
    transmitting, using the array of transmit antenna elements, the plurality of amplified beamformed signals; and
    decorrelating, by an intermodulation decorrelator, one or more intermodulation products of the plurality of input signals or plurality of beamformed signals prior to conversion to nonlinear signals.

10. The method according to claim 9, wherein the power amplifiers are digital power amplifiers, nonlinear power amplifiers, switching-mode power amplifiers, two-sided push-pull digital amplifiers, or solid state power amplifiers (SPPA).

11. The method according to claim 9, wherein the satellite further comprises a plurality of digital to analog converters (DACs), the method further comprising:
    converting, using the DACs, the beamformed signals to analog signals, and wherein the plurality of transmit signals corresponds to the analog signals.

12. The method according to claim 9, wherein the transmit signals provided to the power amplifiers correspond to a plurality of decorrelated beamformed signals.

13. The method according to claim 12, wherein decorrelating the beamformed signals comprises temporally or spatially decorrelating the intermodulation products of the beamformed signals.

14. The method according to claim 12, wherein decorrelating the beamformed signals comprises in-band or out-of-band dithering the beamformed signals, in-band or out-of-band crest-factor-reductions, and/or delta-sigma modulation.

15. The method according to claim 9, wherein the beamformer generates the plurality of beamformed signals prior to the plurality of input signals being converted from a linear signal to a non-linear signal.

16. The method according to claim 9, further comprising:
decorrelating, using the intermodulation decorrelator, one or more intermodulation products by spreading the one or more intermodulation products of the plurality of beamformed signals out-of-band.

17. The method according to claim 9, the method further comprising reducing, using the beamformer, the correlation of the intermodulation products (IMPs) of a first beamformed signal with the IMPs of a second beamformed signal.

18. A method for improving the power efficiency of a communications satellite having an array of RF receive antennas, a plurality of low noise amplifiers, a plurality of ADCs, and a beamformer, the method comprising:

receiving a plurality of input signals via the RF receive antennas;

amplifying, using the low noise amplifiers, the plurality of input signals;

converting, using the ADCs, the amplified input signals to digital signals;

beamforming, using the beamformer, the digital signals; and decorrelating, by an intermodulation decorrelator, one or more intermodulation products of the plurality of input signals or the amplified input signals prior to converting the input signals or amplified input signals to nonlinear signals.

19. The method according to claim 18, wherein decorrelating the input signals or the amplified input signals comprises in-band or out-of-band dithering the amplified input signals, in-band or out-of-band crest-factor-reduction of the amplified input signals, and/or delta-sigma modulation of the amplified input signals.

20. The method according to claim 18, wherein the ADCs are low resolution ADCs, and wherein the digital signals have fewer than 8 bits of resolution.

* * * * *